March 10, 1970 TOKINORI KOZAWA ET AL 3,500,222

SEMICONDUCTOR AMPLIFIER GAIN CONTROL CIRCUIT

Filed Sept. 13, 1967

INVENTORS
TOKINORI KOZAWA
ICHIRO MIWA

BY Craig & Antonelli

ATTORNEYS 3,500,222
Patented Mar. 10, 1970

3,500,222

SEMICONDUCTOR AMPLIFIER GAIN CONTROL CIRCUIT

Tokinori Kozawa, Kokubunji-shi, and Ichiro Miwa, Tokyo, Japan, assignors to Hitachi, Ltd., Tokyo, Japan, a corporation of Japan Filed Sept. 13, 1967, Ser. No. 667,516
Claims priority, application Japan, Sept. 19, 1966, 41/61,390
Int. Cl. H03f 3/30
U.S. Cl. 330—29 2 Claims

ABSTRACT OF THE DISCLOSURE

This specification discloses a gain control circuit for a semiconductor amplifier, wherein a variable load impedance such as transistor, diode or the like is inserted in the load circuit of the amplifier, and said impedance is controlled by means of an AGC signal, thereby controlling the gain of the amplifier without changing various active element parameters.

BACKGROUND OF THE INVENTION

This invention relates to a gain control circuit for a semiconductor amplifier, and more particularly it pertains to an automatic gain control circuit for a transistor amplifier.

In general, the amplifier gain control is effected to maintain an output voltage constant even if the amplitude of an input voltage is greatly varied, thereby automatically controlling the gain of the amplifier. It is a frequent practice that such gain control is carried out at the first stage of an amplifier. Especially in the case of automatic gain control for the intermediate frequency amplifier of a television receiver, the width of the linear region on which the maximum allowable input voltage depends, cross-modulation, etc. become critical. In a conventional amplifier composed of semiconductor elements, especially transistors, its gain is controlled by changing the emitter current or collector voltage, that is, by changing the D.C. bias, since the gain is a function of the emitter current and collector voltage. Typical examples of the AGC system will be described.

(1) Forward AGC

In this system, with increase in an input signal, the emitter current increases, resulting in decrease of the collector voltage which leads to decrease in the characteristic frequency $f_T$, whereby the gain is correspondingly decreased. Although the maximum allowable input voltage is as high as about 100 mv. and less cross modulation occurs, a high AGC driving power is required because of a high power loss caused by the fact that the emitter current increases (10 ma. or higher) in an attempt to decrease the gain.

(2) Reverse AGC

In this system, with increase of an input signal, the emitter current decreases to thereby decrease the gain. Such system is disadvantageous in that the maximum allowable input voltage is as low as about 10 mv. and cross modulation is increased when the gain is decreased (that is, when the input is increased).

Furthermore, so-called diode AGC has been proposed wherein the output of the preceding stage is divided by means of a fixed resistance and the resistance of a diode which is varied in accordance with an AGC voltage, thereby controlling the gain. However, this AGC system has such disadvantages as low maximum allowable input voltage and high bias current of the diode. Also, there have been proposed other types of AGC such as dynamic damper AGC utilizing the non-linearity of a diode connected in parallel with an input matching transformer and variable negative feedback AGC wherein the emitter impedance of a common-emitter amplifier is controlled with an AGC voltage so as to change the feedback ratio, thereby controlling the gain. However, all of these AGC systems are disadvantageous in that the maximum allowable input voltage is low and/or the output impedance is greatly changed so that the bandpass characteristic is changed, and therefore they cannot be utilized for color television receivers or the like. That is, the bandpass characteristics of a color television intermediate frequency amplifier are very complex, as compared with those of a black-and-white television intermediate frequency amplifier. Therefore in such color television intermediate frequency amplifier, very critical problems will arise if the bandpass characteristics thereof are varied with variations in the parameters of transistors constituting the amplifier. In order to avoid such problems, the interstage tuning circuit was so designed as to contribute to the bandpass characteristics in accordance with the prior art. Recently, it is a more frequent practice to determine the band characteristics by inserting a block filter in each of the input and output. In this case, a circuit of which the input and output impedances are not substantially changed by AGC is desired because the band characteristics are badly affected by a great change of the input and output impedances.

Accordingly, it is a primary object of this invention to provide a gain control circuit for a semiconductor amplifier wherein the input and output impedances of the semiconductor active elements are not substantially changed by an AGC signal.

Another object of the present invention is to provide an AGC circuit for a semiconductor amplifier wherein the maximum allowable input voltage is high and the frequency bandpass characteristic is not substantially changed.

Still another object of the present invention is to facilitate the constructing of an AGC circuit for a semiconductor amplifier in the form of IC (integrated circuit).

The above objects of the brief introduction to the present invention will be more fully understood and further objects, features and advantages will become apparent from a study of the following description in connection with the accompanying drawings.

DESCRIPTION OF PREFERRED EMBODIMENTS

Figures 1, 2:
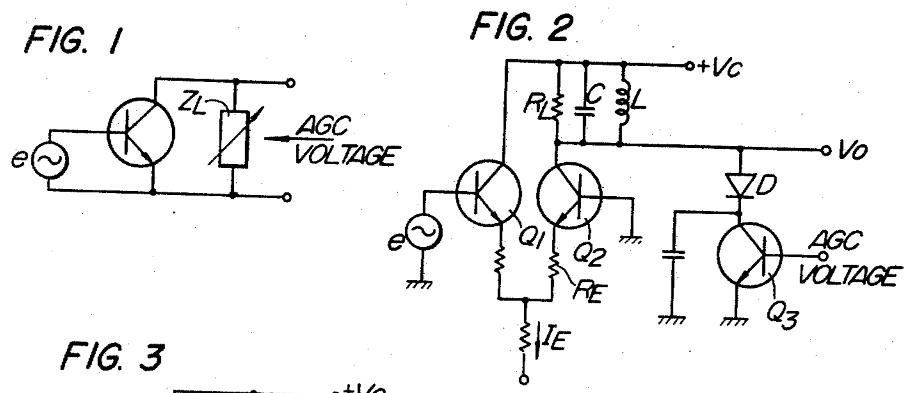
FIG. 1 is a schematic circuit diagram useful for illustrating the principle of the present invention.
FIGS. 2 to 5 are circuit diagrams showing embodiments of the present invention, respectively.

FIG. 1 shows the principle of this invention. By changing a load impedance $Z_L$ without disturbing the D.C. bias condition of a transistor, it is possible to control the gain of the transistor without affecting the input impedance. In this case, the load $Z_L$ may be formed by any of a MOSFET (metal oxide semiconductor field effect transistor), diode, transistor and other variable resistance element.

The invention will now be described in connection with embodiments as shown in FIGS. 2 through 5.

FIG. 2 shows a combination of a variable impedance or diode with a differential amplifier, wherein $Q_1$ and $Q_2$ are amplifier transistors constituting the differential amplifier, C and L are a capacitor and a coil, respectively, which constitute a tuning circuit, $R_L$ is a load resistor of the tuning circuit, $R_E$ is an emitter resistor D is a diode used as a variable impedance element, and $Q_3$ is a transistor for controlling a bias current supplied to the diode D. The dynamic range (defined in accordance with such relation as Differential Gain=0.5 db) on the input side depends upon the values of $R_E$ and $I_E$ and not upon the load impedance. To meet requirements, therefore, $R_E$ and $I_E$ can be selected independently of the load. Furthermore, since the bias current is supplied to the diode through the coil L, the bias conditions of the transistors $Q_1$ and $Q_2$ are not disturbed, and the input impedance is not influenced by variations in the load resistance since the reverse transfer admittance $Y_{12} \doteqdot 0$ in the differential amplifier. In this case, the gain control range depends upon the range of variation in impedance $Z_D$ of the diode and the impedance $Z_L$ of the tuning circuit LCR. However, it may be considered that $Z_L \doteqdot R_L$ in the neighborhood of the resonance frequency, and therefore the gain control range is given by log $R_L/Z_{D\ min}$ db. In the actual case, from the band characteristics, $R_L$=2–3 KΩ and $Z_D$ is such that $Z_{D\ max} \doteqdot \infty$ and $Z_{D\ min} \doteqdot 10\Omega$. This means that a gain control of about 45 db becomes possible. The necessary bias current for the diode may be about 3 ma. at maximum. Although, the number of circuit elements is increased as compared with the conventional systems, such increase in the number of circuit elements constitutes no disadvantage when the circuit is intended to be constructed as an integrated circuit.

Figure 3:
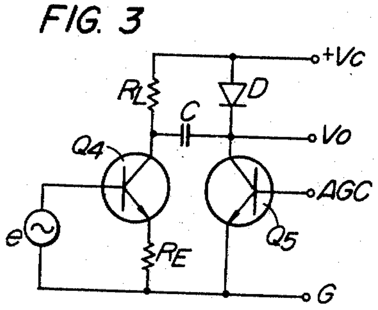

FIG. 3 shows an arrangement in which use is made of a resistance load, a bias current for a diode D is controlled by means of a transistor $Q_5$ and a capacitor C is provided to prevent the D.C. bias condition of a transistor $Q_4$ from being disturbed. The gain control range is substantially the same as that of the arrangement shown in FIG. 2.

Figure 4:
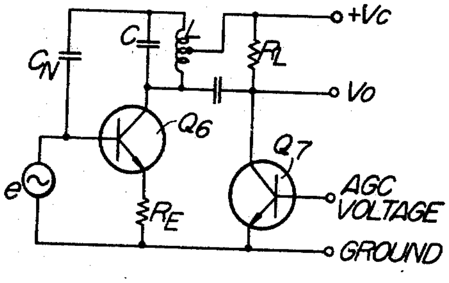

FIG. 4 shows an arrangement in which use is made of a change in the collector output impedance as variable impedance. A D.C. load $R_L$ for a transistor $Q_7$ is a load resistance for a transistor $Q_6$ and which also serves as a damping resistor for the tuning circuit.

If the transistor $Q_7$ is supplied with such an AGC voltage as to increase the collector current thereof, the operating point of the transistor is caused to approach the saturation region, with a result that the collector impedance is greatly decreased. Contrarily, if such an AGC voltage as to reduce the collector current toward zero is applied, then the collector impedance becomes substantially infinite. This greatly varying collector impedance is operatively connected in parallel with the load resistance $R_L$ of the transsistor $Q_6$, whereby the gain is controlled. In this case the condition for neutrality is always met because the D.C. bias condition of the transistor $Q_6$ remains unchanged irrespective of the gain control. Thus, any change in the load resistance has no effect on the input impedance.

Figure 5:
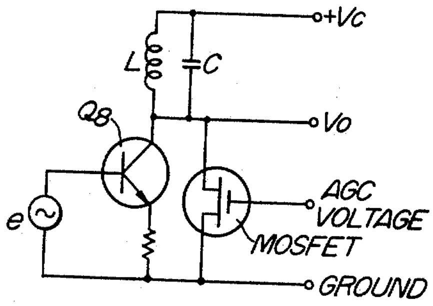

FIG. 5 shows an arrangement utilizing the two terminals such as source and drain terminals of a MOSFET. MOSFET has such a property that the impedance between the source and the drain is greatly changed depending upon a gate voltage and yet of a good linearity. Such an excellent property of MOSFET is utilized.

As described above, in accordance with the present invention, the gain control can be effected without affecting the input impedance and without adversely influencing the bandpass characteristics since such gain control is carried out by changing a load impedance. Although conventionally the reverse bias type and forward bias type systems have predominantly been used, only the forward bias type one can be applied to color television, and therefore technical difficulties have been experienced in constructing a transistor for AGC in the same chip as that for an ordinary amplifier transistor when it is intended to be fabricated in the form of an integrated circuit. However, in accordance with the present invention, it is possible to integrate an intermediate frequency circuit.

What is claimed is:

1. An automatic gain control stabilized amplifier having improved frequency bandpass characteristics comprising:
   amplifying means for amplifying an input signal applied thereto;
   means for generating an AGC voltage corresponding to the output signal of the amplifying means;
   load means operatively connected to said amplifying means and including at least an inductor;
   a power source connected to supply electric power to said amplifying means through said inductor;
   a resistor having one terminal connected to said power source; and
   a transistor having an emitter connected to a reference potential source, a collector connected to the remaining terminal of said resistor and a base to which said AGC voltage is applied;
   the juncture of said remaining terminal of said resistor and the collector of said transistor being electrically coupled to the output terminal of said amplifying means.

2. An automatic gain control stabilized amplifier having improved frequency band pass characteristics comprising:
   amplifying means for amplifying an input signal applied thereto;
   load means operatively connected to said amplifying means;
   a power source connected to supply electric power to said amplifying means through at least a part of said load means;
   means for generating an AGC voltage corresponding to the output signal of the amplifying means;
   said load means including variable impedance means for varying the impedance of the load means in accordance with said AGC signal;
   said variable impedance means including a semiconductor diode connected in the forward direction with respect to the polarity of said power source with one terminal of the diode being coupled to the output terminal of said amplifying means;
   said diode being connected in parallel circuit relationship with at least part of the load means and separate, parallel direct current paths being provided to the amplifying means and said diode;
   bias current supplying means including a transistor for supplying to said diode a bias current corresponding to said AGC signal to control the impedance of said diode, the collector of said transistor being connected to the remaining terminal of the diode, the emitter of said transistor being connected to a source of reference potential, and said AGC signal being applied to the base of said transistor;
   means for effectively isolating the input impedance of the amplifying means from variations in the impedance of the load means thereby obtaining a self-stabilized output gain from the amplifier without adversely affecting its frequency bandpass characteristics; and
   said means for isolating the input impedance of the amplifying means from the variation in impedance of the load means being comprised at least in part of a parallel connected load resistor and load inductor connected intermediate the power source and the semiconductor diode and output terminal of the amplifying means.

References Cited

UNITED STATES PATENTS

| | | | |
|---|---|---|---|
| 2,363,985 | 11/1944 | Moser | 330—145 X |
| 3,268,828 | 8/1966 | Mollinga | 330—29 X |
| 3,319,177 | 5/1967 | Aemmer | 330—29 |
| 3,368,157 | 2/1968 | Fumea et al. | 330—29 X |

FOREIGN PATENTS

| | | |
|---|---|---|
| 920,723 | 3/1963 | Great Britain. |

ROY LAKE, Primary Examiner

J. B. MULLINS, Assistant Examiner

U.S. Cl. X.R.

330—144, 145